United States Patent
Schuegraf et al.

[11] Patent Number: 6,141,204
[45] Date of Patent: *Oct. 31, 2000

[54] CAPACITOR CONSTRUCTIONS AND SEMICONDUCTOR PROCESSING METHOD OF FORMING CAPACITOR CONSTRUCTIONS

[75] Inventors: Klaus Florian Schuegraf, Fountain Hills, Ariz.; Bob Carstensen, Boise, Id.

[73] Assignee: Micron Technology, Inc., Boise, Id.

[ * ] Notice: This patent is subject to a terminal disclaimer.

[21] Appl. No.: 09/090,003

[22] Filed: Jun. 3, 1998

Related U.S. Application Data

[63] Continuation of application No. 08/582,445, Jan. 3, 1996, Pat. No. 5,771,150.

[51] Int. Cl.$^7$ ..................................................... H01G 4/06
[52] U.S. Cl. ................ 361/313; 361/321.4; 361/321.5; 257/306; 257/310
[58] Field of Search ................... 361/306.3, 311–313, 361/303–305, 321.1, 321.2, 321.3, 321.4, 321.5, 321.6, 322; 257/300, 306, 307, 310, 311, 297; 438/250, 253, 254, 244–243, 240

[56] References Cited

U.S. PATENT DOCUMENTS

| | | | |
|---|---|---|---|
| 4,981,810 | 1/1991 | Fazan et al. | 438/305 |
| 5,142,438 | 8/1992 | Reinberg et al. | 361/313 |
| 5,145,801 | 9/1992 | Chhabra | 438/397 |
| 5,155,057 | 10/1992 | Dennison et al. | 438/254 |
| 5,286,674 | 2/1994 | Roth et al. | 438/624 |
| 5,371,026 | 12/1994 | Hayden et al. | 438/275 |
| 5,416,041 | 5/1995 | Schwalke | 438/404 |
| 5,429,979 | 7/1995 | Lee et al. | 438/253 |
| 5,679,595 | 10/1997 | Chen et al. | 438/253 |
| 5,771,150 | 6/1998 | Schuegraf et al. | 361/321.4 |

OTHER PUBLICATIONS

Kaga, T. et al., "A 0.29–vm$^2$MIM–CROWN Cell and Process Technologies for 1–Gigabit DRAMS", *IEDM*1994, PP. 927–929.

*Primary Examiner*—Kristine Kincaid
*Assistant Examiner*—Anthony Dinkins
*Attorney, Agent, or Firm*—Wells, St. John, Roberts, Gregory & Matkin, P.S.

[57] ABSTRACT

A capacitor construction includes, i) a dense mass of electrically insulative oxide; ii) an electrically conductive inner capacitor plate overlying and contacting the electrically insulative oxide mass; iii) a capacitor dielectric layer overlying the inner capacitor plate and oxide mass, the capacitor dielectric layer comprising a nitride; iv) an electrically conductive outer capacitor plate overlying the capacitor dielectric layer; and v) the dense mass of electrically insulative oxide contacting the inner capacitor plate being characterized by a wet etch rate of less than or equal to about 75 Angstroms/minute in a 100:1 by volume H$_2$O:HF solution.

15 Claims, 2 Drawing Sheets

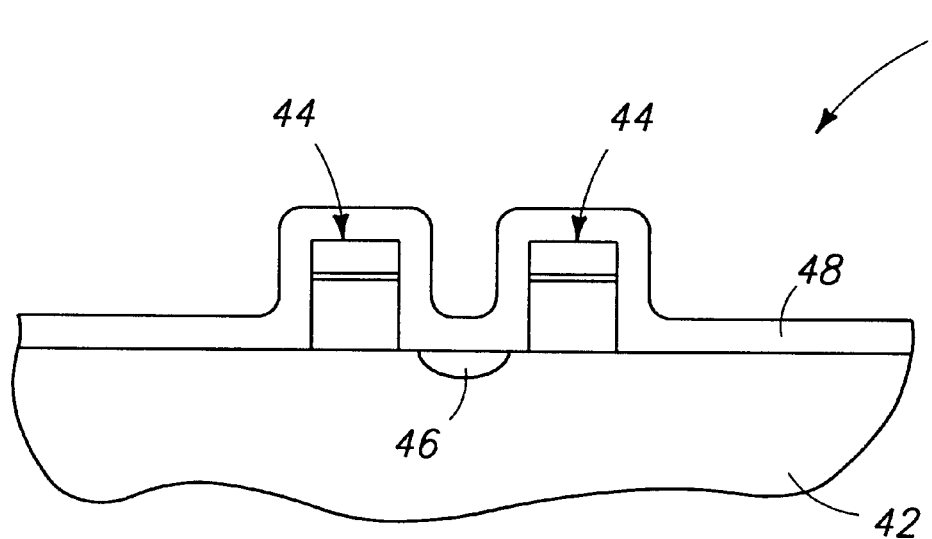
_Fig 4_
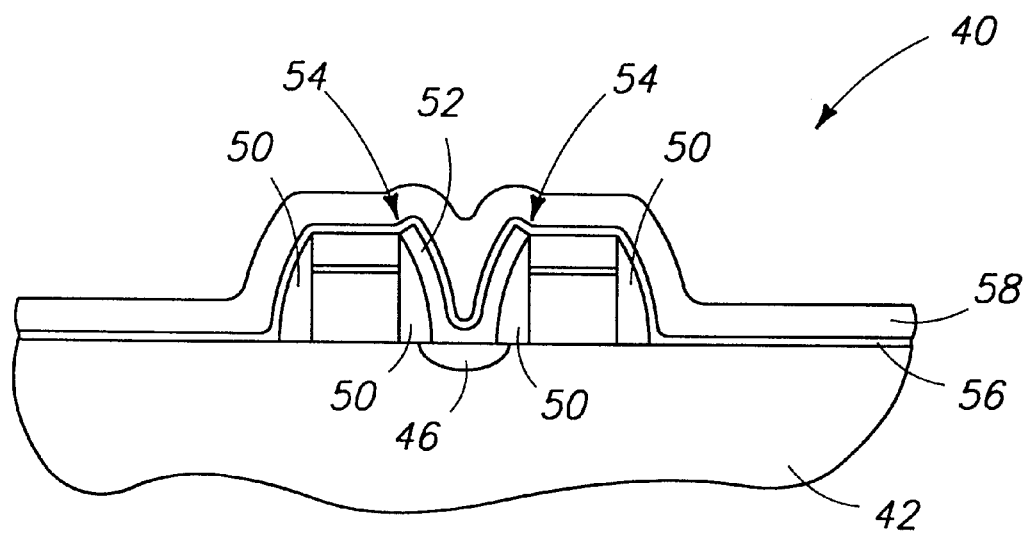
_Fig 5_

CAPACITOR CONSTRUCTIONS AND SEMICONDUCTOR PROCESSING METHOD OF FORMING CAPACITOR CONSTRUCTIONS

This patent application resulted from a continuation application of U.S. patent application Ser. No. 08/582,445 filed Jan. 3, 1996, now U.S. Pat. No. 5,771,150.

TECHNICAL FIELD

This invention relates to capacitor constructions and to semiconductor processing methods of forming capacitor constructions.

BACKGROUND OF THE INVENTION

The reduction in memory cell size required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the cell area. These include structures utilizing trench and stacked capacitors, as well as the utilization of new capacitor dielectric materials having higher dielectric constants.

Capacitors comprise two electrically conductive plates separated by an intervening capacitor dielectric layer. An example theoretical ideal construction is shown in FIG. 1. There illustrated is a wafer fragment 10 having a mass or layer 12 of oxide, such as undoped $SiO_2$ deposited by decomposition of tetraethylorthosilicate (TEOS). A patterned lower electrically conductive capacitor plate 14 overlies oxide layer 12. A cell dielectric layer 16 overlies lower plate 14, with an outer conductive plate. 14 being shown in the form of an electrically conductive layer 18. Common preferred materials for layer 16 are electrically insulative nitrides, specifically $Si_3N_4$.

Advanced low pressure chemical vapor deposition techniques for providing silicon nitride unfortunately provide some deposition selectivity of the nitride for underlying silicon as opposed to underlying oxide. Conductively doped polycrystalline silicon is a typical and preferred material of construction for a capacitor storage node 14. The undesired selectivity of the deposition creates adverse thickness depletion of the deposited nitride dielectric layer, as shown in FIG. 2 at location 15. Like numerals from the first described embodiment are utilized where appropriate, with differences being indicated by the suffix "a". As is apparent, the thickness of deposited nitride layer 16a is significantly depleted at the interface or transition edge between the underlying oxide and silicon of storage node 14. This undesirably results in bread loafing of the outer capacitor plate layer 18a. Even more problematic, the very thin nature of the cell dielectric layer 16a at the oxide silicon interface 15 results in reduced capacitance at best and a catastrophic poly 18a to poly 14 short at worst.

One prior art solution to this problem is to provide underlying oxide layer 12 to be plated or coated with a layer of nitride, such as $Si_3N_4$. However, integrating deposited nitride into a fully integrated circuit process flow poses difficulties.

FIG. 3 illustrates a more typical prior art construction in the context of a DRAM memory cell where the problem is found to manifest. FIG. 3 illustrates a wafer fragment 20 comprised of a bulk monocrystalline silicon substrate 22 and a pair of adjacent word lines 24. Word lines 24 are encapsulated in an oxide material 26 ($SiO_2$) to provide electrical insulation thereof. A conductively doped diffusion region 28 is provided relative to monocrystalline silicon substrate 22 intermediate word lines 24. A capacitor construction 30 is provided intermediate word lines 24 and in ohmic electrical connection with diffusion region 28. Such comprises an inner or lower capacitor plate 32, typically formed of conductively doped polycrystalline silicon. A nitride cell dielectric layer 34 is provided outwardly of substrate 22, oxide regions 26 and lower capacitor plate 32. Again and as shown, such results in undesired thickness depletion of layer 34 at the transition edge or interface of storage capacitor plate 32 and encapsulating oxide 26. A cell polysilicon layer 36 is provided outwardly of cell dielectric layer 34. Again the thickness depletion results in reduced capacitance or a fatal short of the capacitor plate through the dielectric layer.

It would be desirable to overcome the above described prior art problems of thickness depletion involving nitride dielectric layers and silicon capacitor plates overlying oxide layers without having to resort to substitution of nitride for oxide.

BRIEF DESCRIPTION OF THE DRAWINGS

Preferred embodiments of the invention are described below with reference to the following accompanying drawings.

FIG. 4 is a diagrammatic sectional view of a semiconductor wafer fragment.

FIG. 5 is a diagrammatic sectional view of a semiconductor wafer fragment.

DETAILED DESCRIPTION OF THE PREFERRED EMBODIMENTS

Figure 1:
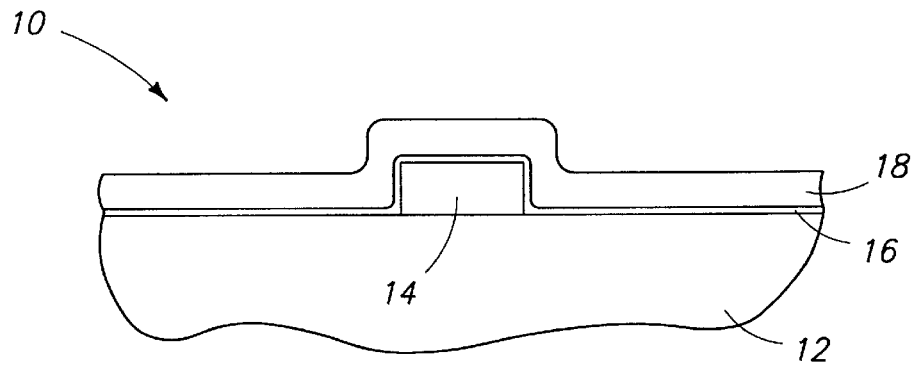
FIG. 1 is a diagrammatic sectional view of a semiconductor wafer fragment.
Figure 2:
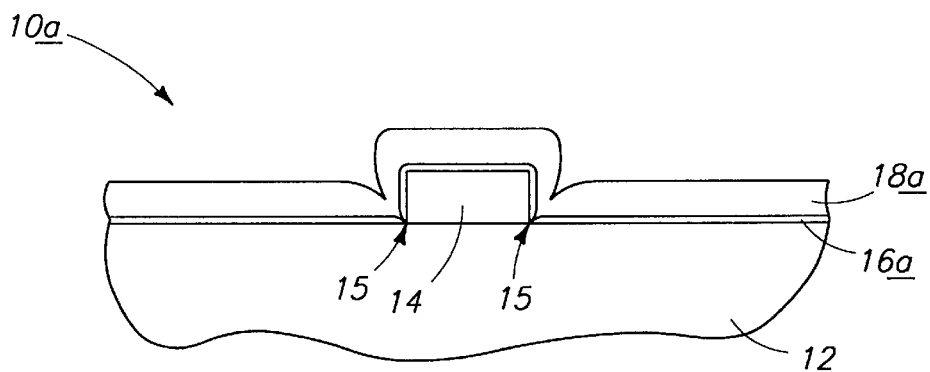
FIG. 2 is a diagrammatic sectional view of a prior art semiconductor wafer fragment and is discussed in the "Background" section above.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a capacitor comprises the following steps:

providing a mass of electrically insulative oxide of a first density;

densifying the electrically insulative oxide mass to a higher second density, the densified oxide mass being characterized by a wet etch rate of less than or equal to about 75 Angstroms/minute in a 100:1 by volume $H_2O$:HF solution;

providing an electrically conductive inner capacitor plate over the underlying electrically insulative oxide layer and thereby defining an insulative layer and inner capacitor plate transition edge;

after densifying the oxide mass, providing a capacitor dielectric layer over the inner capacitor plate and densified oxide mass, the capacitor dielectric layer comprising a nitride, the nitride containing capacitor dielectric layer having less thickness depletion at the transition edge than would otherwise occur were the electrically insulative oxide mass not subject to said densifying; and providing an electrically conductive outer capacitor plate over the capacitor dielectric layer.

In accordance with another aspect of the invention, a capacitor comprises:

a dense mass of electrically insulative oxide;

an electrically conductive inner capacitor plate overlying and contacting the electrically insulative oxide mass;

a capacitor dielectric layer overlying the inner capacitor plate and oxide mass, the capacitor dielectric layer comprising a nitride;

an electrically conductive outer capacitor plate overlying the capacitor dielectric layer; and the dense mass of electrically insulative oxide contacting the inner capacitor plate being characterized by a wet etch rate of less than or equal to about 75 Angstroms/minute in a 100:1 by volume $H_2O$:HF solution.

Referring to FIG. 4, a semiconductor wafer fragment in process in accordance with one aspect of the invention is indicated generally with reference numeral 40. Such comprises a bulk monocrystalline silicon substrate 42 having word line composite construction 44 provided thereon. An electrically conductive diffusion region 46 lies between word lines 44. An electrically insulative oxide mass or layer 48 is provided over word lines 44 and substrate 42. Such preferably comprises an oxide, such as predominately being $SiO_2$. Such layer 48 might be doped or undoped.

An example technique for providing undoped $SiO_2$ includes the prior art method of bubbling an inert gas through liquid TEOS and into a reactor where the wafer is maintained at a temperature of from 650° C. to 750° C. Alternately, layer 48 might be doped with one or both of boron or phosphorus, by way of example. $SiO_2$ deposited by decomposition of TEOS has a first density that can be characterized relative to an etch rate were such layer to be etched. For example, an as-deposited or first density of layer 48 by decomposition of TEOS is characterized by a wet etch rate of about 175 Angstroms/minute in a 100:1 by volume $H_2O$:HF solution at ambient room temperature and pressure conditions.

In accordance with the invention, electrically insulative oxide mass 48 is densified to a higher second density. The second density of the densified oxide mass is characterized by a lower wet etch rate of less than or equal to about 75 Angstroms/minute in the same 100:1 by volume $H_2O$:HF solution, with the preferred density being characterized by a wet etch rate of from about 55 Angstroms/minute to about 65 Angstroms/minute in the 100:1 by volume $H_2O$:HF solution. One example technique for such densification includes exposing oxide layer or mass 48 to a steam ambient at a temperature of at least about 800° C. at atmospheric pressure for a time period effective to impart said densifying, typically from five to ten minutes. Alternately by way of example only, densifying can occur by exposing the oxide mass to rapid thermal processing having a temperature ramp rate of at least 75° C./second to achieve a temperature of at least about 800° C. for a time period effective to impart said densifying. An example atmosphere could include $N_2$ or $O_2$, and atmospheric pressure. An example ramp at 75° C./second would be to 900° C. where it is held for 20 seconds, followed by a ramp to 1000° C. and maintaining the wafer at such temperature for an additional 20 seconds.

Figure 3:
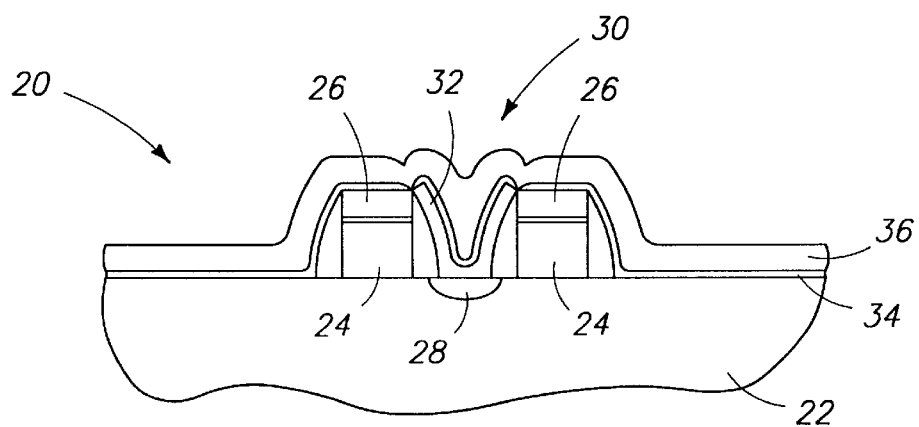
FIG. 3 is a diagrammatic sectional view of another prior art semiconductor wafer fragment and is discussed in the "Background" section above.

Referring to FIG. 5, oxide mass 48 is anisotropically etched by any suitable means to produce the illustrated densified oxide sidewall spacers 50. Subsequently, an electrically conductive inner capacitor plate 52 is provided over electrically insulative oxide layer or spacers 50, thereby defining insulative layer and inner capacitor plate transition edges 54. Subsequently, a nitride containing capacitor dielectric layer 56 is provided over inner capacitor plate 52 and densified oxide mass 50. Nitride containing capacitor dielectric layer 56 has less thickness depletion at transition edge 50 (FIG. 5) than otherwise would occur were electrically insulative oxide mass 48/50 not subject to said densifying (FIG. 3).

Subsequently, an electrically conductive outer capacitor plate layer 58 is provided over capacitor dielectric layer 56.

In the preferred and described embodiment, densification of the oxide mass of layer 48 occurs before the step of providing inner capacitor plate 52 thereover, and as described with respect to the specific embodiment even before anisotropic etching thereof. However of significance to the methodical aspects of the invention, such densification of the oxide mass will occur prior to provision of capacitor dielectric layer 56.

The above described preferred embodiment results in an improved resultant capacitor construction having the described improved characteristics.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A capacitor comprising:

a dense mass of electrically insulative oxide;

an electrically conductive inner capacitor plate contacting the electrically insulative oxide mass;

a capacitor dielectric layer overlying the inner capacitor plate and oxide mass, the capacitor dielectric layer comprising a nitride, the nitride physically contacting the oxide of the dense mass and the inner capacitor plate;

an electrically conductive outer capacitor plate overlying the capacitor dielectric layer; and the dense mass of electrically insulative oxide being characterized by a wet etch rate of less than or equal to about 75 Angstroms/minute in a 100:1 by volume $H_2O$:HF solution.

2. The capacitor of claim 1 wherein the oxide predominately comprises $SiO_2$.

3. The capacitor of claim 1 wherein the oxide predominately comprises undoped $SiO_2$ deposited by decomposition of tetraethylorthosilicate.

4. The capacitor of claim 1 wherein the oxide predominately comprises doped $SiO_2$.

5. The capacitor of claim 1 wherein the capacitor dielectric layer predominately comprises $Si_3N_4$.

6. The capacitor of claim 1 wherein the dense oxide mass is characterized by said wet etch rate of from about 55 Angstroms/minute to about 65 Angstroms/minute in a 100:1 by volume $H_2O$:HF solution.

7. The capacitor of claim 1 wherein the oxide predominately comprises $SiO_2$, and the capacitor dielectric layer predominately comprises $Si_3N_4$.

8. The capacitor of claim 1 wherein the capacitor dielectric layer predominately comprises $Si_3N_4$, and the oxide predominately comprises doped $SiO_2$.

9. The capacitor of claim 1 wherein,
the dense oxide mass is characterized by said wet etch rate of from about 55 Angstroms/minute to about 65 Angstroms/minute in a 100:1 by volume $H_2O$:HF solution; and
the oxide predominately comprises $SiO_2$.

10. The capacitor of claim 1 wherein,
the dense oxide mass is characterized by said wet etch rate of from about 55 Angstroms/minute to about 65 Angstroms/minute in a 100:1 by volume $H_2O$:HF solution; and
the oxide predominately comprises undoped $SiO_2$ deposited by decomposition of tetraethylorthosilicate.

11. The capacitor of claim 1 wherein,
the dense oxide mass is characterized by said wet etch rate of from about 55 Angstroms/minute to about 65 Angstroms/minute in a 100:1 by volume $H_2O$:HF solution; and
the oxide predominately comprises doped $SiO_2$.

12. A capacitor comprising:
a dense mass of undoped $SiO_2$
an electrically conductive inner capacitor plate contacting the undoped $SiO_2$;
a capacitor dielectric layer overlying the inner capacitor plate and undoped $SiO_2$ mass, the capacitor dielectric layer predominately comprising $Si_3N_4$, the nitride physically contacting the undoped $SiO_2$ of the mass and the inner capacitor plate;
an electrically conductive outer capacitor plate overlying the $Si_3N_4$ capacitor dielectric layer; and
the dense mass of undoped $SiO_2$ being characterized by a wet etch rate of from about 55 Angstroms/minute to about 65 Angstroms/minute in a 100:1 by volume $H_2O$:HF solution.

13. A capacitor comprising:
a dense mass of silicon oxide;
an inner capacitor plate overlying and contacting the silicon oxide mass;
a capacitor dielectric layer overlying and contacting both the inner capacitor plate and silicon oxide mass, the capacitor dielectric layer comprising a nitride;
an electrically conductive outer capacitor plate overlying the capacitor dielectric layer; and
the dense silicon oxide mass being characterized by a wet etch rate of less than or equal to about 75 Angstroms/minute in a 100:1 by volume if $H_2O$:HF solution.

14. A capacitor comprising:
a dense mass of undoped $SiO_2$;
an inner capacitor plate overlying and contacting the dense mass of undoped $SiO_2$;
a capacitor dielectric layer overlying the inner capacitor plate and the undoped $SiO_2$ mass, the capacitor dielectric layer predominately comprising $Si_3N_4$ and contacting both the inner capacitor plate and the undoped $SiO_2$ mass;
an electrically conductive outer capacitor plate overlying the $Si_3N_4$ capacitor dielectric layer; and
the dense mass of undoped $SiO_2$ being characterized by a wet etch rate of from about 55 Angstroms/minute to about 65 Angstroms/minute in a 100:1 by volume $H_2O$:HF solution.

15. A capacitor construction comprising:
a substrate;
a diffusion region in the substrate;
a dense mass of electrically insulative oxide supported by the substrate;
an electrically conductive inner capacitor plate physically contacting the electrically insulative oxide mass and the diffusion region, the inner capacitor plate comprising polysilicon;
a capacitor dielectric layer overlying the inner capacitor plate and oxide mass, the capacitor dielectric layer comprising a nitride, the nitride physically contacting the oxide of the dense mass and the polysilicon of the inner capacitor plate;
an electrically conductive outer capacitor plate overlying the capacitor dielectric layer; and
the dense mass of electrically insulative oxide being characterized by a wet etch rate of less than or equal to about 75 Angstroms/minute in a 100:1 by volume $H_2O$:HF solution.

* * * * *

UNITED STATES PATENT AND TRADEMARK OFFICE
CERTIFICATE OF CORRECTION

PATENT NO.    : 6,141,204
DATED         : October 31, 2000
INVENTOR(S)   : Klaus Florian Schuegraf; Bob Carstensen It is certified that error appears in the above-identified patent and that said Letters Patent are hereby corrected as shown below:

Col. 1, line 37    Replace "plate. 14" with --plate 14,--

Col. 6, line 5     Delete "if" after the word --volume--

Signed and Sealed this

Fifteenth Day of May, 2001

Attest:

NICHOLAS P. GODICI

*Attesting Officer*    Acting Director of the United States Patent and Trademark Office